(12) United States Patent
Chien et al.

(10) Patent No.: US 8,094,117 B2
(45) Date of Patent: Jan. 10, 2012

(54) SHIFT REGISTER ARRAY, AND DISPLAY APPARATUS

(75) Inventors: Chih Yuan Chien, Hsinchu (TW); Yu Ju Kuo, Hsinchu (TW); Ming Sheng Lai, Hsinchu (TW); Kuo Hsing Cheng, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/873,936

(22) Filed: Sep. 1, 2010

(65) Prior Publication Data

US 2010/0328293 A1    Dec. 30, 2010

Related U.S. Application Data

(63) Continuation of application No. 11/683,143, filed on Mar. 7, 2007, now Pat. No. 7,924,259.

(30) Foreign Application Priority Data

Sep. 1, 2006   (TW) ................................ 95132481 A

(51) Int. Cl.
    *G09G 3/36*         (2006.01)
    *G11C 19/00*       (2006.01)

(52) U.S. Cl. ............................. 345/100; 377/64; 377/72

(58) Field of Classification Search ............ 345/87–104; 377/54, 64–81
See application file for complete search history.

(56) References Cited

U.S. PATENT DOCUMENTS

| | | | |
|---|---|---|---|
| 5,517,542 A | 5/1996 | Huq | |
| 6,690,347 B2 * | 2/2004 | Jeon et al. | 345/100 |
| 7,561,656 B2 * | 7/2009 | Chang et al. | 377/64 |
| 7,746,314 B2 * | 6/2010 | Wei et al. | 345/100 |
| 7,791,582 B2 * | 9/2010 | Chang et al. | 345/100 |
| 2007/0046327 A1 * | 3/2007 | Wei et al. | 326/46 |

FOREIGN PATENT DOCUMENTS

| | | |
|---|---|---|
| CN | 1135625 | 11/1996 |
| TW | 200529130 | 9/2005 |
| TW | 200622971 | 7/2006 |
| WO | 2005/122178 | 12/2005 |

OTHER PUBLICATIONS

Taiwan Office Action mailed May 18, 2011.
English translation of abstract of TW 200622971.
English translation of abstract of TW 200529130.

* cited by examiner

*Primary Examiner* — Amr Awad
*Assistant Examiner* — Kenneth Bukowski
(74) *Attorney, Agent, or Firm* — Thomas, Kayden, Horstemeyer & Risley, LLP

(57) ABSTRACT

A display apparatus comprises a shift register array. The shift register array comprises a plurality of shift registers. At least one shift register comprises a first transistor, a second transistor, a third transistor, and a driving circuit. The gate and the first electrode of the first transistor receive an input signal. The gate of the second transistor is coupled to the second electrode of the first transistor. The second electrode of the second transistor generates an output signal. The first electrode of the second transistor receives a clock signal. The third transistor is used to pull down a voltage level at the gate of the second transistor. The driving circuit determines an on/off status of the third transistor in response to the input signal and the output signal.

10 Claims, 11 Drawing Sheets

# SHIFT REGISTER ARRAY, AND DISPLAY APPARATUS

CROSS-REFERENCES TO RELATED APPLICATIONS

This application is a continuation application of U.S. Ser. No. 11/683,143, filed on Mar. 7, 2007, now U.S. Pat. No. 7,924,259, which claims the benefit from the priority of Taiwan Patent Application No. 095132481 filed on Sep. 1, 2006, the disclosures of which are incorporated herein by reference in their entirety.

CROSS-REFERENCES TO RELATED APPLICATIONS

Not applicable

BACKGROUND OF THE INVENTION

1. Field of the Invention

The present invention relates to a shift register, a shift register array, and a display apparatus; in particular, the invention relates to a shift register, a shift register array, and a display apparatus, which utilize input signals, output signals, and clock signals to decrease the stress, resulted from having a bias for a long time, of the transistors thereof.

2. Descriptions of the Related Art

Gate drivers and source drivers are disposed out of panels of most of the liquid crystal displays, and are configured to generate gate pulse signals and data signals. However, this way would cost much so other ways are developed. For example, manufacturing a gate driver, comprising shift registers, on a glass substrate is a so-called integrated driving circuit.

An amorphous thin film transistor process is often used for an active matrix liquid crystal display (AMLCD) in the present days. There are many disadvantages when shift registers are disposed on a glass substrate under this process. For example, the panel would operate abnormally because one or some of the shift registers are biased for a long time when the panel is lighted up.

U.S. Patent Publication No. 2004/0046729 discloses a shift register 1, as shown in FIG. 1. It has the above-mentioned defect. Firstly, in addition to driving a transistor 104, configured to be pull-up, node B further drives a transistor 102 and a transistor 103. The node B is overloaded, so an output signal of the shift register 1 is delayed. Furthermore, a transistor 101 and the transistor 102 need to have a size ratio larger than 1:16 for a better efficiency at node A. As a matter of result, $V_{GS}$ of the transistor 101 is equal to about $V_{ON}-V_{OFF}$. This high cross voltage increases the current flowing through the transistor 101, and the node A generates a bias for a long time. Besides, the transistor 101 also has a bias for a long time because the voltage of node E is larger than 0V. The aforementioned defects cause that the panel, which uses this shift register 1, is unable to operate normally over a long period of time.

FIG. 2 is an ideal timing diagram of the shift register in FIG. 1. CKV denotes a positive clock; CKVB denotes a negative clock; GOUT[N−1], GOUT[N], and GOUT[N+1] denotes output signals of shift registers in different stages. N−1 is a previous stage of N, N is a previous stage of N+1, and N is the shift register shown in FIG. 1. Signal C denotes an ideal waveform at the node B in FIG. 1. The signal C is formed by CKV, GOUT[N−1], and GOUT[N]. The aforementioned defect leads to distortion of the signal C, and the lifetime of the shift register would be, therefore, reduced.

If amorphous silicon is adopted as the material of a liquid crystal display (LCD) panel, the bias defect suffered by the transistor should be taken into consideration more seriously so that the design of the shift register can ensure an operating time of the LCD panel would not be affected. U.S. Patent Publication No. 2004/0165692 discloses a shift register 3 shown in FIG. 3; this shift register 3 cannot overcome this defect yet. In this patent, a transistor 301 suffers an over bias and the lifetime of the transistor 301 is reduced thereby due to a high voltage of node D. Accordingly, the lifetime of the shift register and the panel is reduced, too.

Accordingly, the current circuitry of shift registers suffers an over bias. This not only delays an output, but also reduces the lifetime of the panel. Therefore, a solution to reducing the bias suffered by any transistor of the shift register is urgently required in this industrial field.

SUMMARY OF THE INVENTION

An object of this invention is to provide a shift register. The shift register comprises a first transistor, a second transistor, a third transistor, and a driving circuit. The first transistor comprises a gate, a first electrode, and a second electrode. The gate and the first electrode of the first transistor receive an input signal. The second transistor comprises a gate, a first electrode, and a second electrode. The gate of the second transistor is coupled to the second electrode of the first transistor. The second electrode of the second transistor generates an output signal. The first electrode of the second transistor receives a first clock signal. The third transistor pulls down a voltage level at the gate of the second transistor. The driving circuit determines an on/off status of the third transistor in response to the input signal and the output signal.

Another object of this invention is to provide a shift register array. The shift register array comprises a plurality of shift register circuits in series. At least one shift register comprises a first transistor, a second transistor, a third transistor, and a driving circuit. The first transistor comprises a gate, a first electrode, and a second electrode. The gate and the first electrode of the first transistor receive an input signal. The second transistor comprises a gate, a first electrode, and a second electrode. The gate of the second transistor is coupled to the second electrode of the first transistor. The second electrode of the second transistor generates an output signal. The first electrode of the second transistor receives a first clock signal. The third transistor pulls down a voltage level at the gate of the second transistor. The driving circuit determines an on/off status of the third transistor in response to the input signal and the output signal.

Another object of this invention is to provide a display apparatus. The display apparatus comprises a display array and a shift register array. The display array is formed by a plurality of pixels. The shifter register array comprises a plurality of shifter registers in series. Each shift register is configured to drive one pixel of the display array. At least one shift register comprises a first transistor, a second transistor, a third transistor, and a driving circuit. The first transistor comprises a gate, a first electrode, and a second electrode. The gate and the first electrode of the first transistor receive an input signal. The second transistor comprises a gate, a first electrode, and a second electrode. The gate of the second transistor is coupled to the second electrode of the first transistor. The second electrode of the second transistor generates an output signal. The first electrode of the second transistor receives a first clock signal. The third transistor pulls down a voltage level at the gate of the second transistor. The driving circuit determines an on/off status of the third transistor in response to the input signal and the output signal.

The present invention reduces a load of a bootstrap voltage of the shift register to have a better efficiency and to extend the lifetime of the LCD panel.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

The object of the present invention is to reduce a load of a bootstrap voltage of the shift register for a better efficiency and for extending a lifetime of an LCD panel. Furthermore, the present invention uses a dual stage inverter to reduce an operating current and to add an operating element for discharging transistors in order to extend the lifetime while the circuit is arranged on the glass.

Figure 4A:
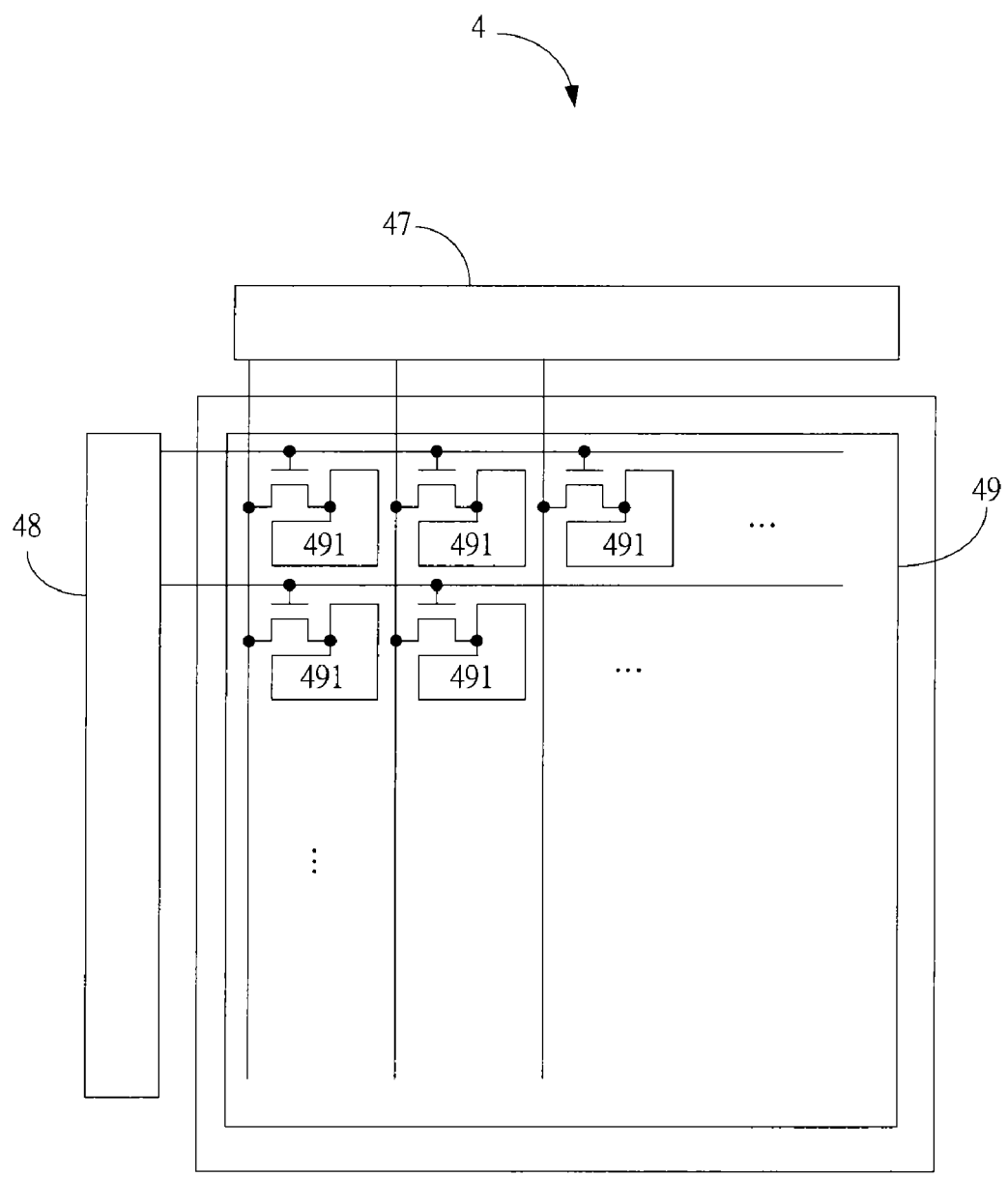
FIG. 4A shows a display panel of a first embodiment in accordance with the present invention.
Figure 4B:
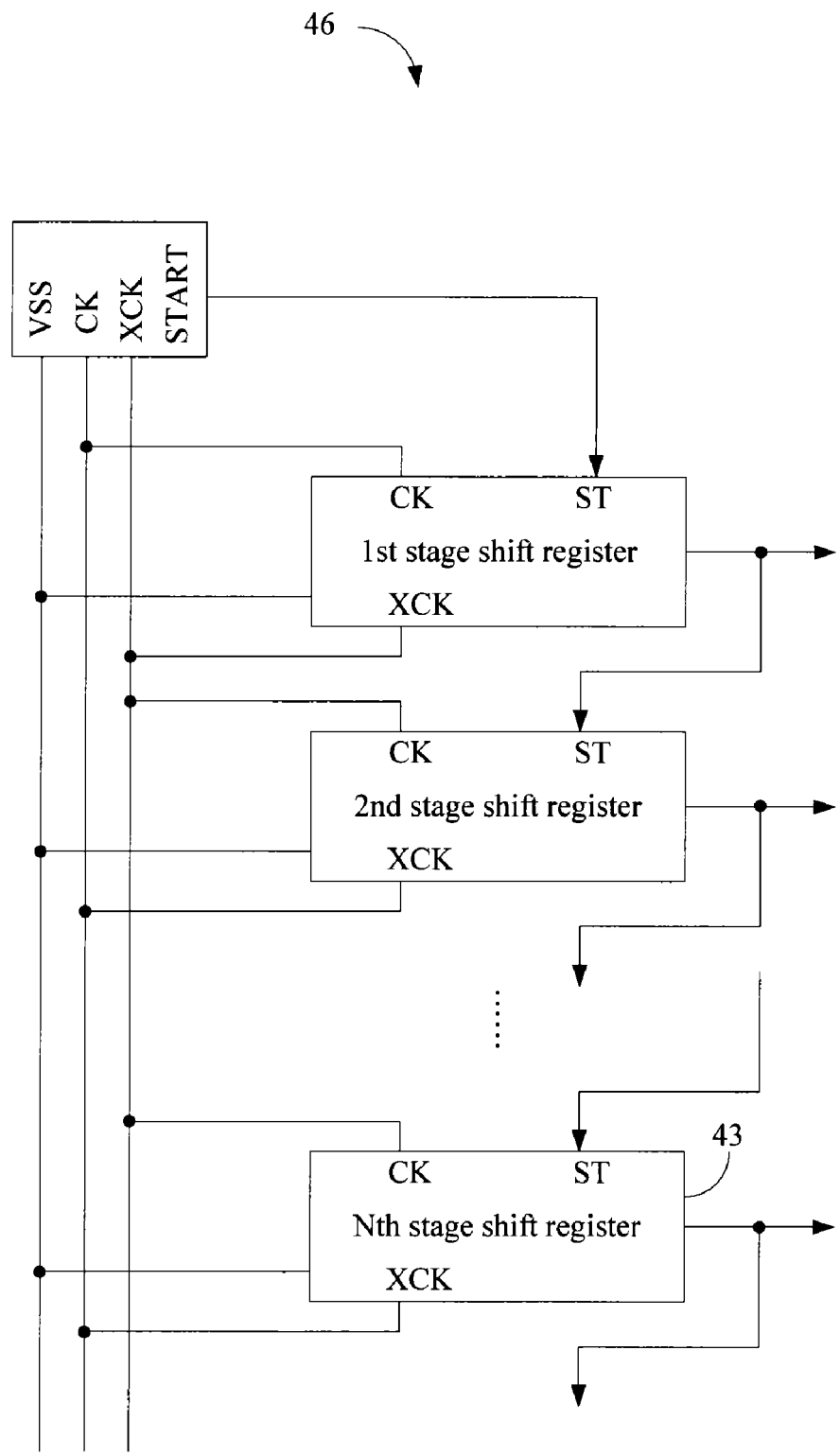
FIG. 4B shows a shift register array of the first embodiment in accordance with the present invention.

A first embodiment of the present invention is a display apparatus. The display apparatus comprises a display panel 4 as shown in FIG. 4A. The display panel 4 comprises a display array 49, a gate driving circuit 48, and a data driving circuit 47. The display array 49 comprises a plurality of pixels 491. FIG. 4B illustrates a shift register array 46 comprised by the gate driving circuit 48. The shift register array 46 comprises a plurality of shift registers, and an output signal of a previous shift register is an input signal of a next shift register. The connection relation among the shift registers is well-known, and is not repeated here. Each shift register is configured to drive a row of pixels of the display array 49. The shift register 43 at the $N^{th}$ stage, for example, is configured to drive the $N^{th}$ row of pixels.

Figure 4C:
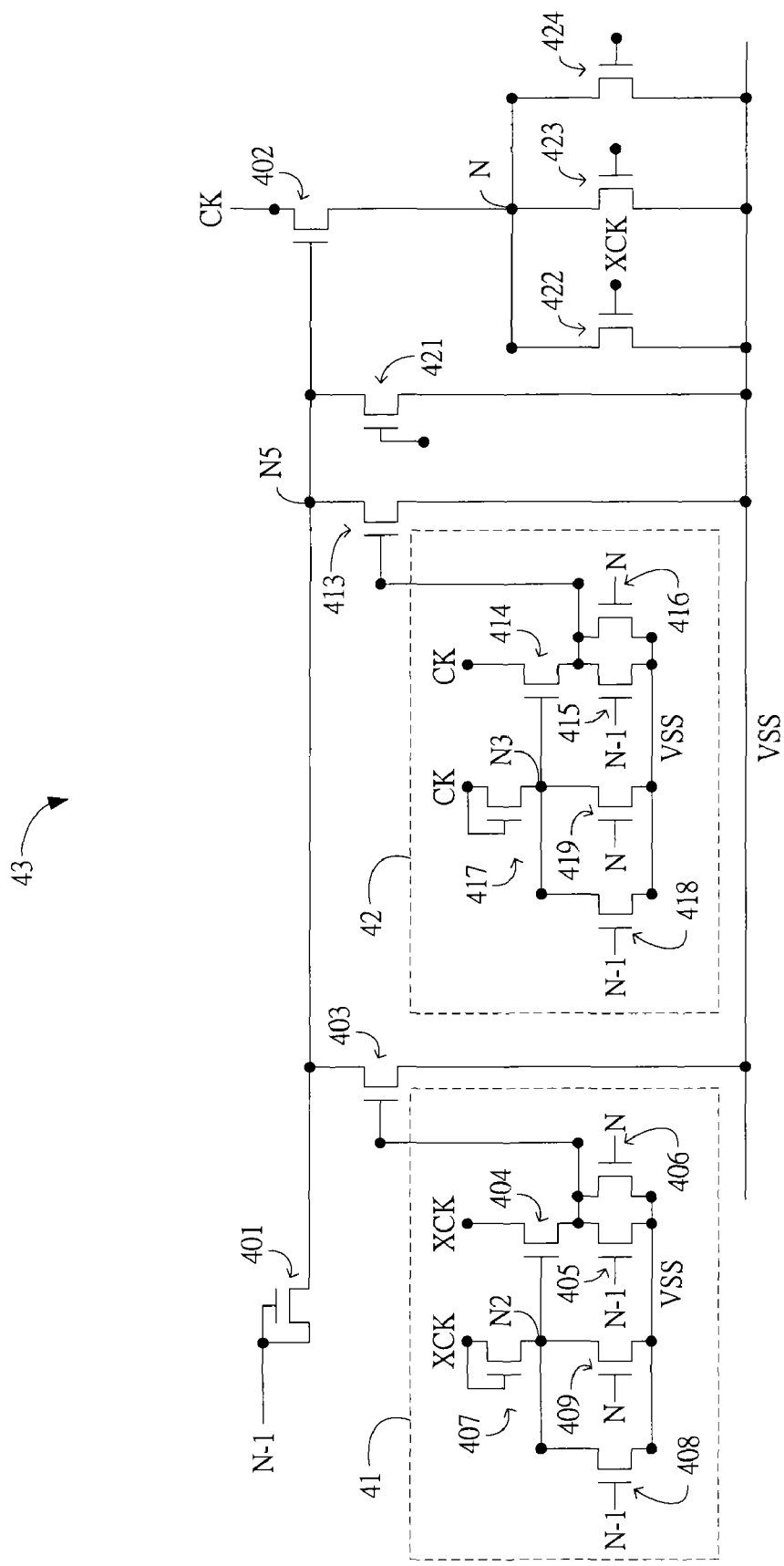
FIG. 4C shows a shift register of the first embodiment in accordance with the present invention.

FIG. 4C shows the shift register 43 of this embodiment. The shift register 43 comprises a first transistor 401, a second transistor 402, two third transistors 403 and 413, two fourth transistors 404 and 414, two fifth transistors 405 and 415, two sixth transistors 406 and 416, two seventh transistors 407 and 417, two eighth transistors 408 and 418, two ninth transistors 409 and 419, an eleventh transistor 421, a twelfth transistor 422, a thirteenth transistor 423, and a fourteenth transistor 424.

Figure 1:
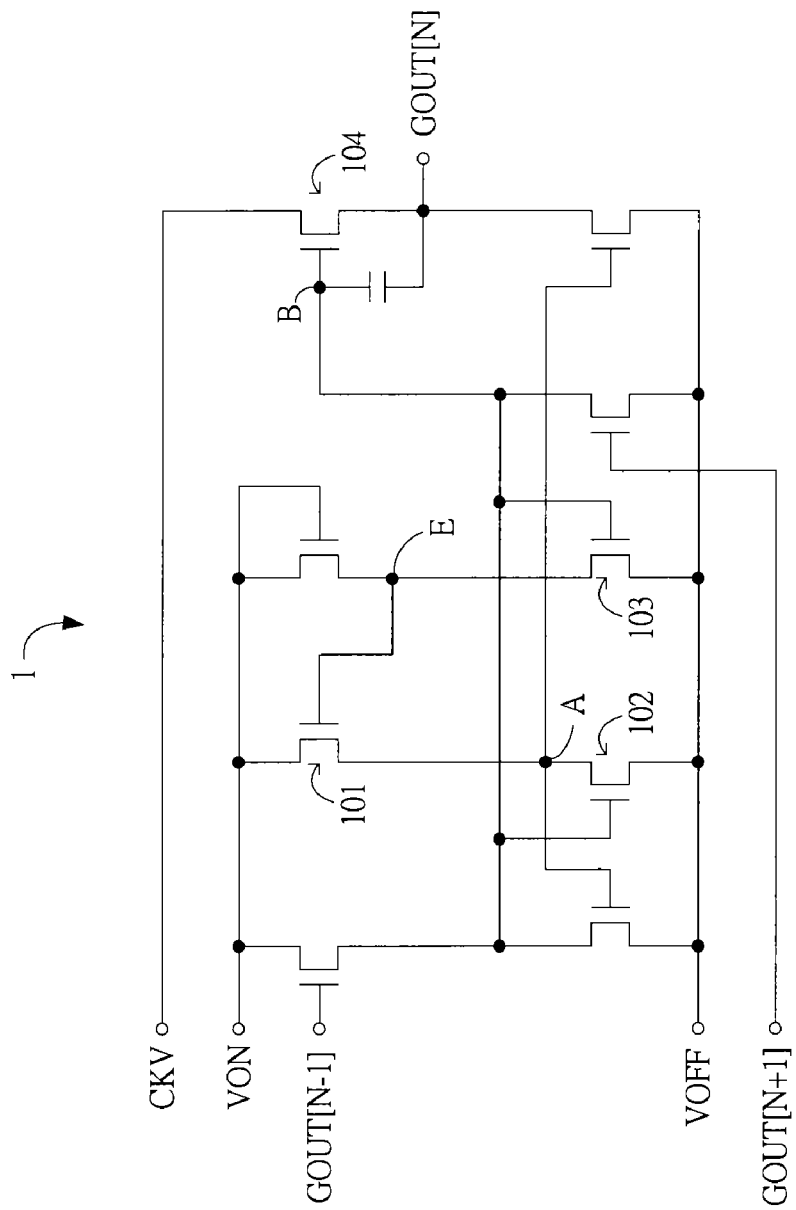
FIG. 1 shows a schematic of a conventional shift register.

The first transistor 401 is an input end of the shift register 43. The second transistor 402 is a pull-up transistor of the shift register 43. A node N5 shown in FIG. 4C, corresponding to the node B shown in FIG. 1, is a gate end of the pull-up transistor. Moreover, N−1 denotes an input signal of the shift register 43. That is, N−1 refers to the output signal from the shift register at the N−$1^{th}$ stage, which corresponds to ST shown in FIG. 4B. N denotes an output signal of the shift register at the $N^{th}$ stage. CK denotes a positive clock signal, and XCK denotes a negative clock signal.

Figure 2:
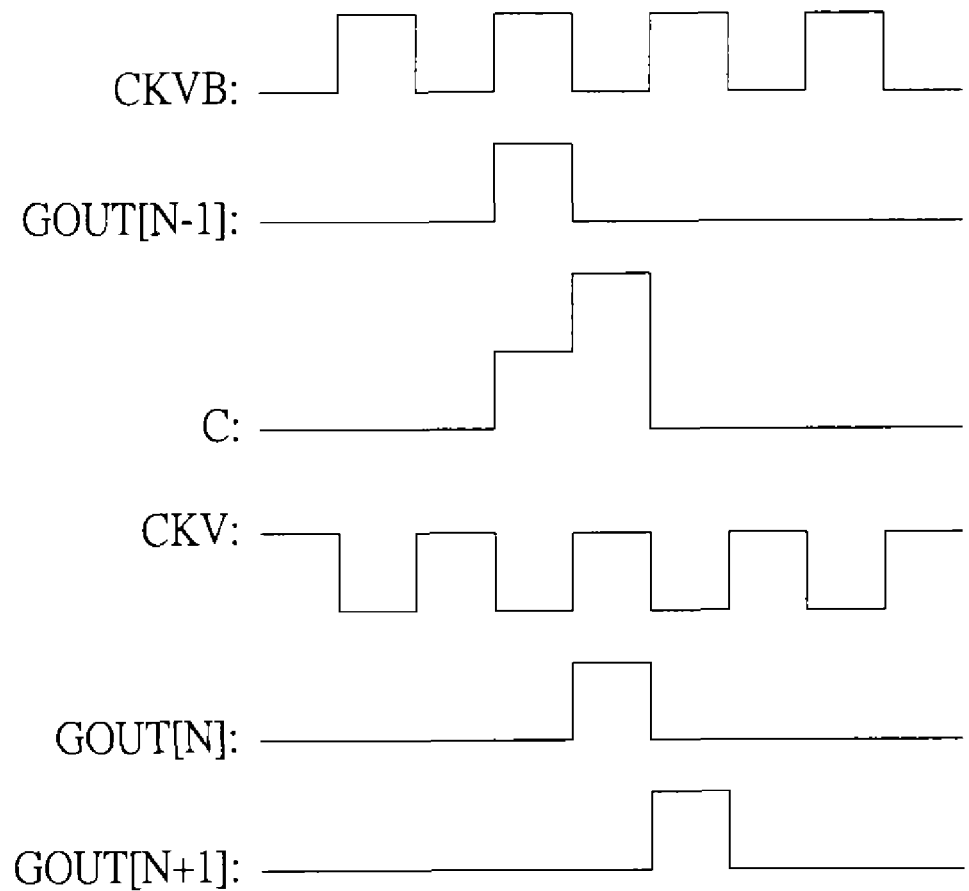
FIG. 2 shows a timing diagram of the shift register in FIG. 1.
Figure 3:
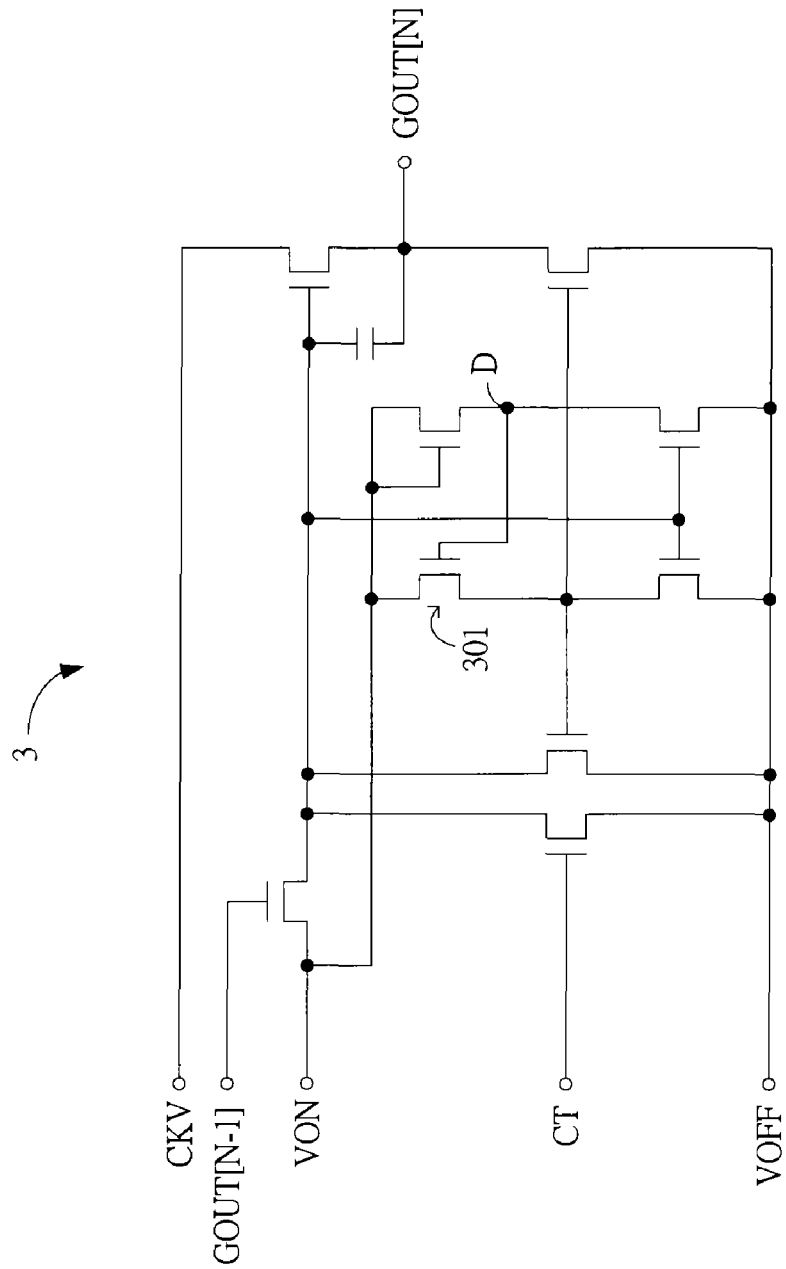
FIG. 3 shows a schematic of another conventional shift register.

A connection reason is illustrated now before a detailed connection of the transistors is described. Referring to FIG. 1 and FIG. 2, the node B is the gate end of the pull-up transistor 104, and the waveform thereof is the signal C in FIG. 2. Since the drawback of the circuit shown in FIG. 1 is the overload at the node B, the present invention is to decrease the load at the node B. CKV, GOUT[N−1], and GOUT[N] shown in FIG. 2 correspond to CK, N−1, and N shown in FIG. 4, respectively.

In this embodiment, the third transistor 403 and 413 are configured to pull-down the voltage level of the gate of the second transistor 402. The fourth transistor 404, the fifth transistor 405, the sixth transistor 406, the seventh transistor 407, the eighth transistor 408, and the ninth transistor 409 form a driving circuit 41 which is configured to determine an on/off status of the third transistor 403. The fourth transistor 414, the fifth transistor 415, the sixth transistor 416, the seventh transistor 417, the eighth transistor 418, and the ninth transistor 419 form another driving circuit 42 which is configured to determined an on/off status of the third transistor 413. The first driving circuit 41 drives the third transistor 403 in response to the input signal N−1, the output signal N, and the negative clock signal XCK. The second driving circuit 42 drives the third transistor 413 in response to the input signal N−1, the output signal N, and the positive clock signal CK.

All transistors of this embodiment are N-type transistors, and each comprises a gate, a first electrode and a second electrode. The first electrode is drain and the second electrode is source. The gate and the first electrode of the first transistor 401 receive the input signal N−1, the gate of the second transistor 402 is coupled to the second electrode of the first transistor 401. The second electrode of the second transistor 402 generates the output signal N. The first electrode of the second transistor 402 receives a positive clock signal CK. The gate of the third transistor 403 is coupled to the driving circuit 41. The second electrode of the third transistor 403 is coupled to a power source VSS. The first electrode of third transistor 403 is coupled to the gate of the second transistor 402. The gate of another third transistor 413 is coupled to another driving circuit 42. The second electrode of the third transistor 413 is coupled to the power source VSS. The first electrode of the third transistor 413 is coupled to the gate of the second transistor 402.

The structure of the first driving circuit 41 is described. The second electrode of the fourth transistor 404 is coupled to the gate of the third transistor 403. The first electrode of the fourth transistor 404 receives the negative clock signal XCK. The gate of the fifth transistor 405 receives the input signal N−1. The second electrode of the fifth transistor 405 is coupled to the power source VSS. The first electrode of the fifth transistor 405 is coupled to the gate of the third transistor 403. The gate of the sixth transistor 406 receives the output signal N. The second electrode of the sixth transistor 406 is coupled to the power source VSS. The first electrode of the sixth transistor 406 is coupled to the gate of third transistor 403. The gate and the first electrode of the seventh transistor 407 receive the negative clock signal XCK. The second electrode of the seventh transistor 407 is coupled to the gate of the fourth transistor 404. The gate of the eighth transistor 408 receives the input signal N−1. The second electrode of the eighth transistor 408 is coupled to the power source VSS. The first electrode of the eighth transistor 408 is coupled to the gate of the fourth transistor 404. The gate of the ninth transistor 409 receives the output signal N. The second electrode of the ninth transistor 409 is coupled to the power source VSS. The first electrode of the ninth transistor 409 is coupled to the gate of the fourth transistor 404. The first electrode of the fourth transistor 404 and the gate and the first electrode of the seventh transistor 407 receive the negative clock signal XCK, which is opposite to the positive clock signal CK received by the first electrode of the second transistor 402.

The structure of another driving circuit 42 is now described. The second electrode of the fourth transistor 414 is coupled to the gate of the third transistor 413. The first electrode of the fourth transistor 414 receives the positive clock signal CK. The gate of the fifth transistor 415 receives the input signal N−1. The second electrode of the fifth transistor 415 is coupled to the power source VSS. The first electrode of the fifth transistor 415 is coupled to the gate of the third transistor 413. The gate of the sixth transistor 416 receives the output signal N. The second electrode of the sixth transistor 416 is coupled to the power source VSS. The first electrode of the sixth transistor 416 is coupled to the gate of third transistor 413. The gate and the first electrode of the seventh transistor 417 receive the positive clock signal CK. The second electrode of the seventh transistor 417 is coupled to the gate of the fourth transistor 414. The gate of the eighth transistor 418 receives the input signal N−1. The second electrode of the eighth transistor 418 is coupled to the power source VSS. The first electrode of the eighth transistor 418 is coupled to the gate of the fourth transistor 414. The gate of the ninth transistor 419 receives the output signal N. The second electrode of the ninth transistor 419 is coupled to the power source VSS. The first electrode of the ninth transistor 419 is coupled to the gate of the fourth transistor 414. The first electrode of the fourth transistor 414 and the gate and the first electrode of the seventh transistor 417 receive the positive clock signal CK, which is positive to the positive clock signal CK received by the first electrode of the second transistor 402.

The gate of the eleventh transistor 421 is coupled to the output end of the shift register at the N+1$^{th}$ stage (not shown). The second electrode of the eleventh transistor 421 is coupled to the power source VSS. The first electrode of the eleventh transistor 421 is coupled to the gate of the second transistor 402. The gate of the twelfth transistor 422 receives the negative clock signal XCK. The second electrode of the twelfth transistor 422 is coupled to the power source VSS. The first electrode of the twelfth transistor 422 is coupled to the second electrode of the second transistor 402. The gate of the thirteenth transistor 423 is coupled to the gate of the third transistor 413, which is not shown in the figure. The second electrode of the thirteenth transistor 423 is coupled to the power source VSS. The first electrode of the thirteenth transistor 423 is coupled to the second electrode of the second transistor 402. The gate of the fourteenth transistor 424 is coupled to the output end of the shift register at the N+1$^{th}$ stage (not shown). The second electrode of the fourteenth transistor 424 is coupled to the power source VSS. The first electrode of the fourteenth transistor 424 is coupled to the second electrode of the second transistor 402.

In this embodiment, the second transistor 402 is the only one transistor that the node N5 drives. Therefore, a higher voltage level can be provided so that the output may be stable without delay. Besides, the lifetime of the display apparatus is extended thereby.

Figure 5:
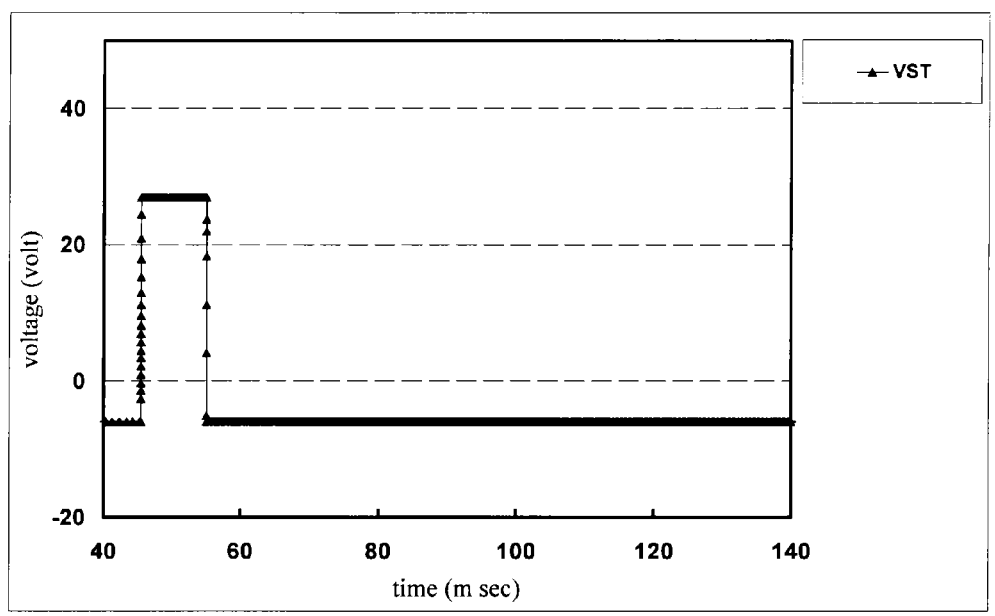
FIG. 5 shows a voltage timing diagram of the present invention.
Figure 6:
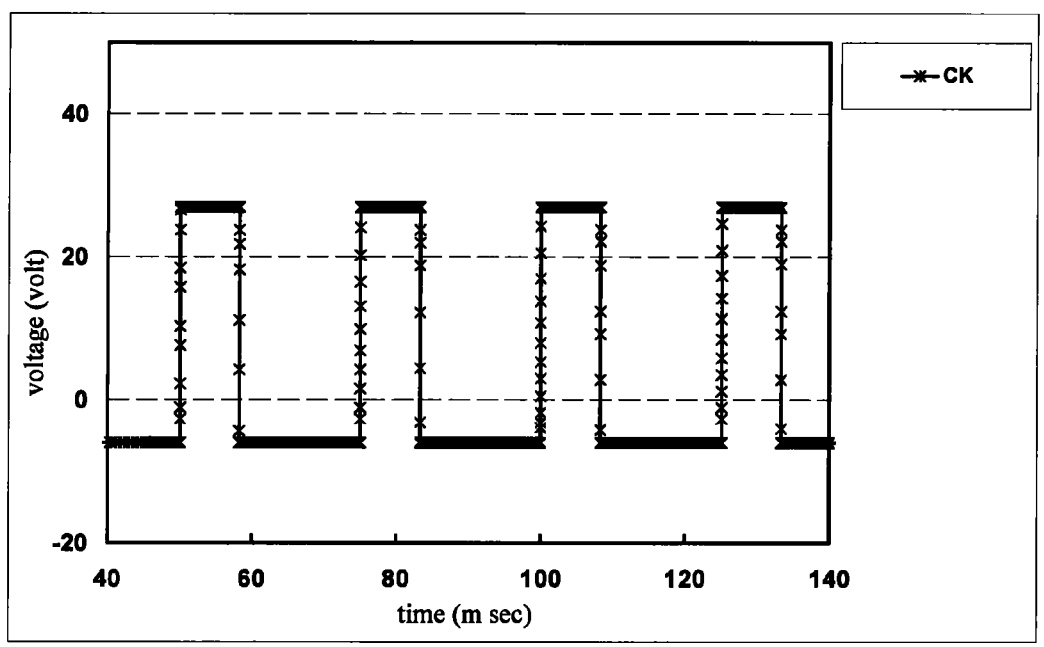
FIG. 6 shows a positive timing diagram of the present invention.

The simulation results of the prior art shown in FIG. 1 and the shift register array of the first embodiment are now analyzed. Both the shift register arrays of the two comprise 22 shift registers, and both the shift registers at the first stage of the prior art and the first embodiment are triggered by the power source $V_{st}$ shown in FIG. 5. Moreover, both the positive clock signal CK uses the clock shown in FIG. 6.

Figure 7A:
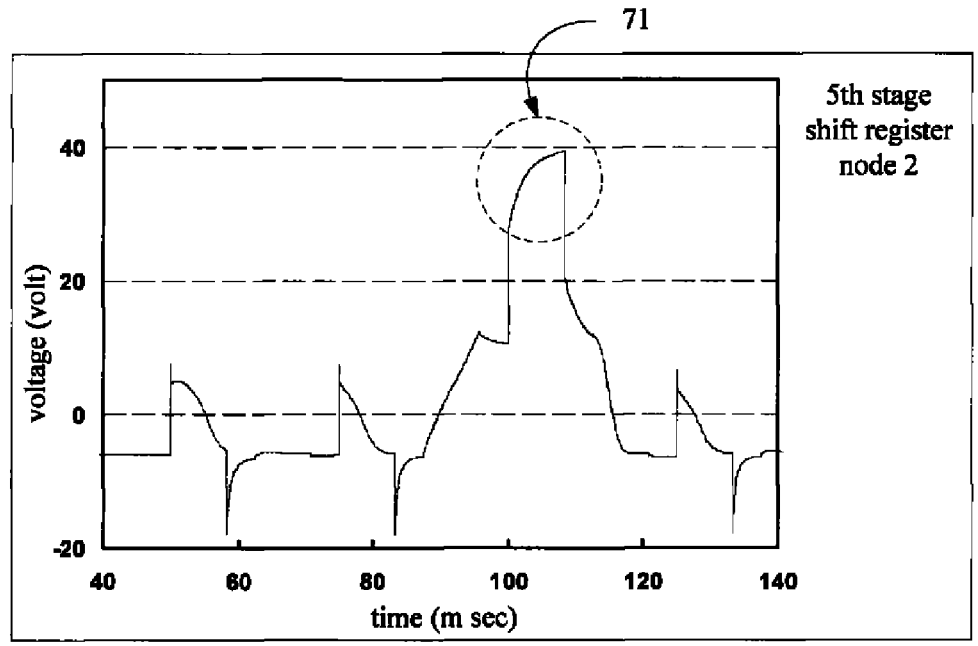
FIG. 7A show a voltage timing diagram of a gate of a conventional pull-up transistor.
Figure 7B:
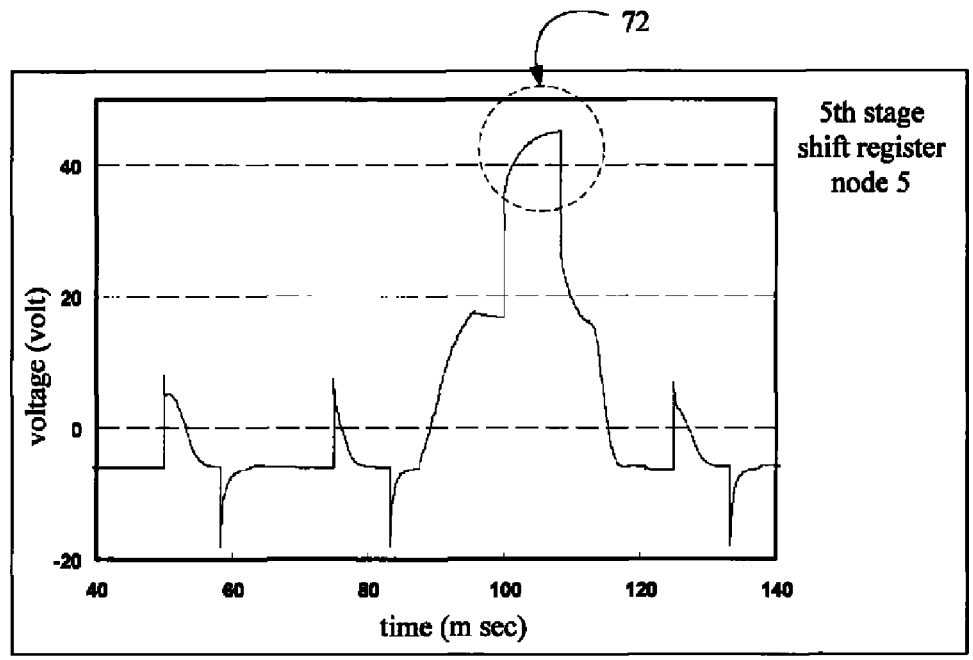
FIG. 7B show a voltage timing diagram of a gate of a pull-up transistor of the first embodiment in accordance with the present invention.

FIG. 7A and FIG. 7B respectively illustrate the gate voltages of the pull-up transistors of the shift registers at the fifth stage, i.e. the voltage at the node N5 in the first embodiment, when the shift register arrays of the prior art and the first embodiment operate under the aforementioned conditions. Comparing FIG. 7A and FIG. 7B, the gate of the pull-up transistor of the first embodiment has a higher voltage than that of the prior art, especially the portions 71 and 72. This is because the load of the gate of the pull-up transistor of the first embodiment is less.

With measuring the output voltages of the shift registers at the fifth stage of the prior art, the rising time is $t_r$=6.81 μs, the falling time is $t_f$=4.7 μs, and the highest voltage is 24.48V. With measuring the output voltages of the shift registers at the fifth stage of the first embodiment, the rising time is $t_r$=4.78 μs, the falling time is $t_f$=4.03 μs, and the highest voltage is 25.86V. One can realize that the rising time and the falling time of the first embodiment are shorter, while the highest voltage of the first embodiment is higher based on the aforementioned data.

With reference to the measured data, FIG. 7A, and FIG. 7B, the load at the gate of the pull-up transistor of the first embodiment is less because the input signal, the output signal, and the clock signals are provided to the driving circuit. The pull-up transistor, hence, has a better efficiency and the output signal of the shift register is better.

Figure 8:
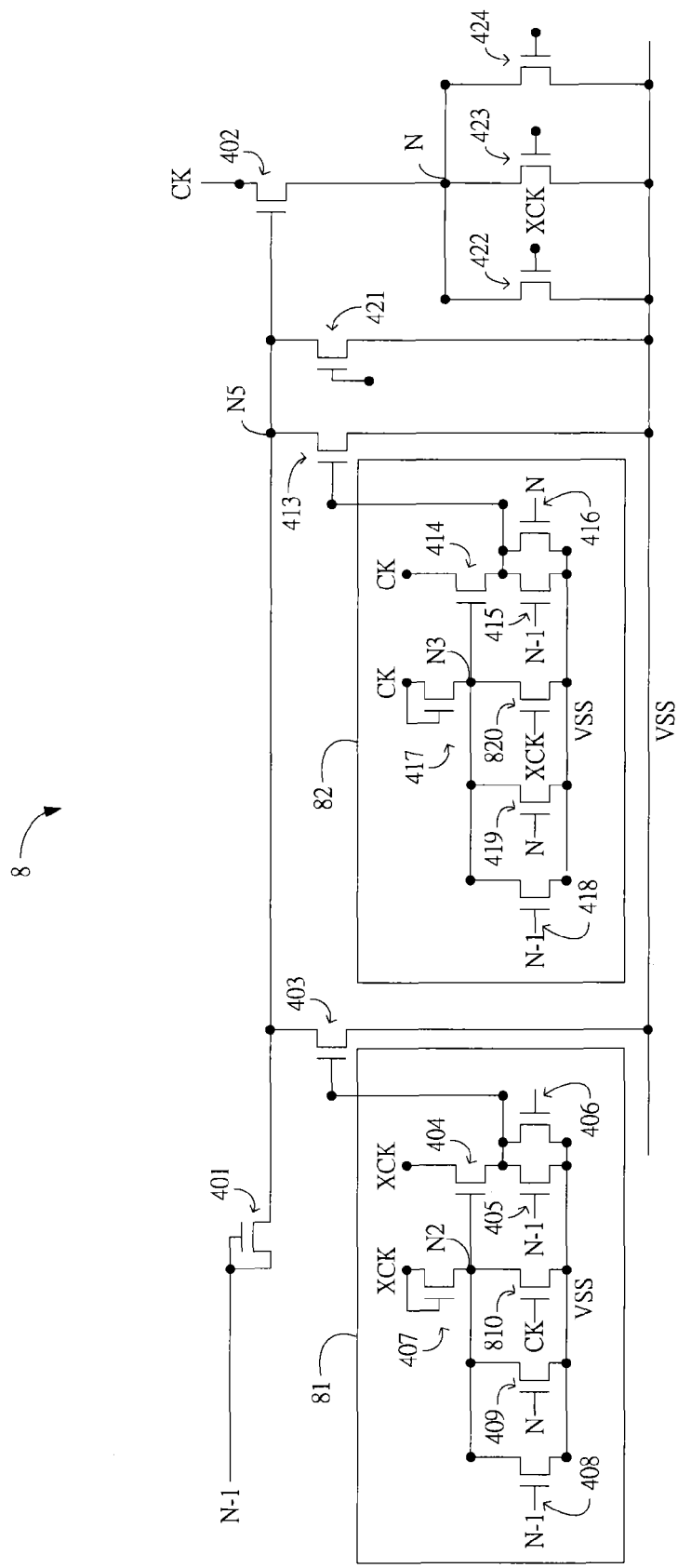
FIG. 8 shows a shift register of a second embodiment in accordance with the present invention.

The second embodiment is also a display apparatus. In contrast with the first embodiment, the second embodiment has the shift register with a different structure. FIG. 8 illustrates a shift register 8 of the second embodiment. In particular, the differences between the shift register 8 and the shift register 43 are that the first driving circuit 81 of the shift register 8 further comprises a tenth transistor 810, and that the second driving circuit 82 further comprises a tenth transistor 820. The two tenth transistors 810 and 820 are configured to decrease the voltage of the node N2 and the node N3, respectively. The voltages of the nodes N2 and the N3 are generated by the seventh transistor 407 and the seventh transistor 417, respectively. The two tenth transistors 810 and 820 form discharging paths.

The two tenth transistors 810 and 820 are also N-type transistors. Both comprise a gate, a first electrode, and a second electrode. The first electrode is drain, and the second electrode is source. More specifically, the gate of the tenth transistor 810 receives the positive clock signal CK. The second electrode of the tenth transistor 810 is coupled to the power source VSS. The first electrode of the tenth transistor 810 is coupled to the gate of the fourth transistor 404. The positive clock signal CK received by the gate of the tenth transistor 810 is opposite to the negative clock signal XCK received by the fourth transistor 404. The gate of the tenth transistor 820 receives the negative clock signal XCK. The second electrode of the tenth transistor 820 is coupled to the power source VSS. The first electrode of the tenth transistor 810 is coupled to the gate of the fourth transistor 414. The positive clock signal CK received by the gate of the tenth transistor 820 is opposite to the negative clock signal XCK received by the fourth transistor 414.

The simulation results of the shift register arrays of the first and second embodiments are analyzed. Both the shift register arrays of the first and second embodiments comprise 22 shift registers, and both the shift registers at the first stage of the first and second embodiments utilize the power source $V_A$ shown in FIG. 5. Moreover, both the positive clock signals CK for the first and second embodiments use the clock shown in FIG. 6.

Figure 9A:
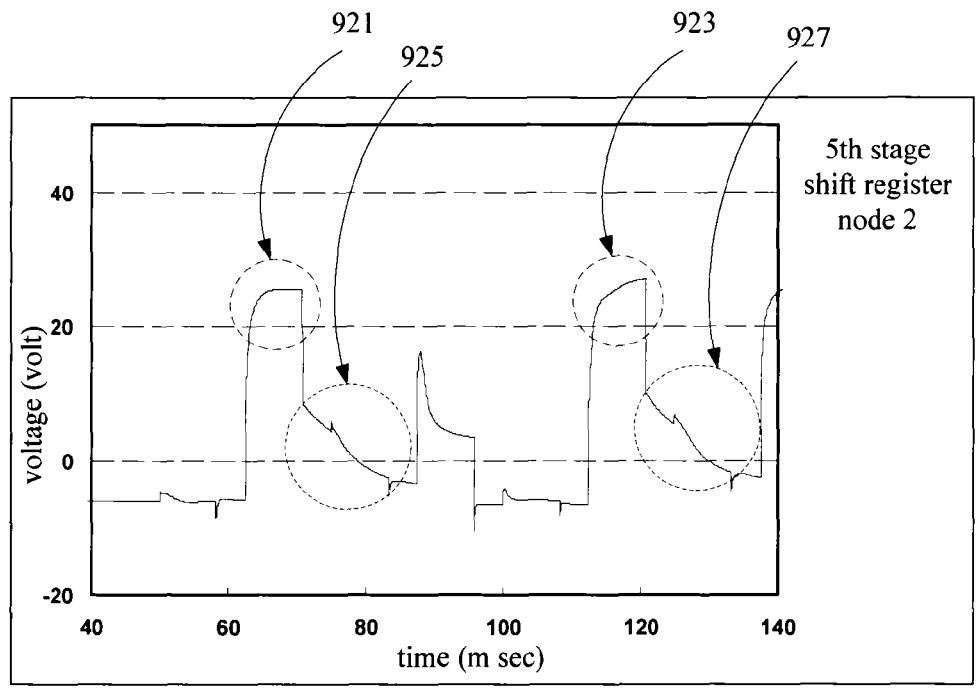
FIG. 9A shows a voltage timing diagram at node N2 of the first embodiment in accordance with the present invention.
Figure 9B:
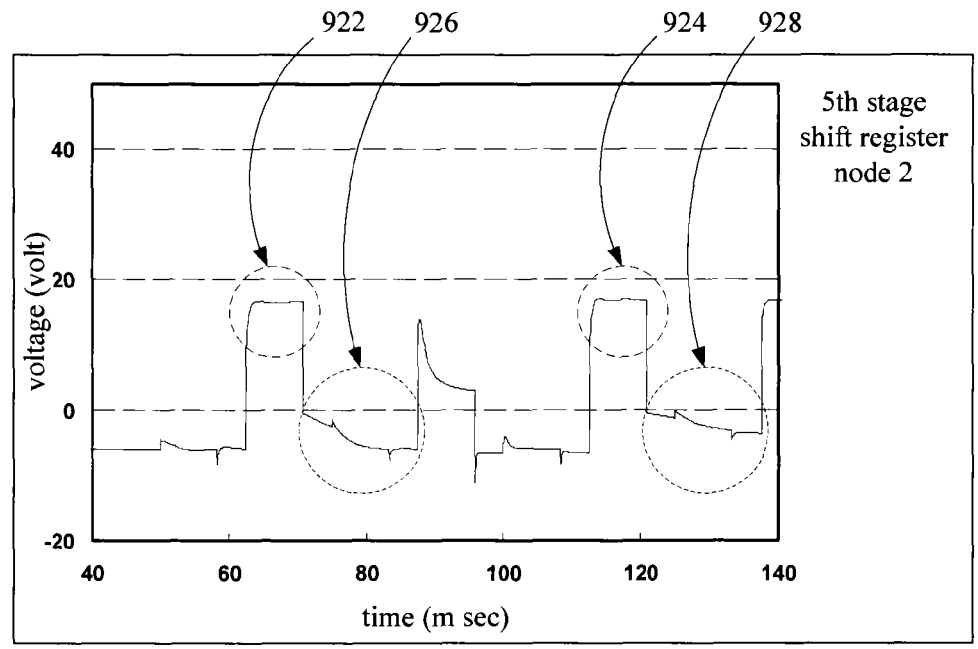
FIG. 9B shows a voltage timing diagram at node N2 of the second embodiment in accordance with the present invention

FIG. 9A and FIG. 9B illustrate the voltages at node N2 of the shift register at the fifth stage of the first and second embodiments respectively. As one may observe, the node N2 of the second embodiment has a lower voltage, especially the portion 922 comparing to the portion 921, and the portion 924 comparing to the portion 923. Moreover, the second embodiment has a pull-down voltage below 0V in comparison with the first embodiment as shown in the portion 926 comparing to the portion 925, and the portion 928 comparing to the portion 927.

With measuring the output voltages of the shift registers at the fifth stage of the first embodiment, the rising time is $t_r$=4.78 μs, the falling time is $t_f$=4.03 μs, and the highest voltage is 25.86V. With measuring the output voltages of the shift registers at the fifth stage of the second embodiment, the rising time is $t_r$=4.7 μs, the falling time is $t_f$=3.95 μs, and the highest voltage is 25.88V. Since the second embodiment comprises the discharging paths in the first driving circuit 81 and the second driving circuit 82, the rising time and the falling time of the second embodiment are shorter and the highest voltage thereof is also higher than those of the first embodiment.

The N-type transistors in the first and second embodiments can be replaced by P-type transistors. If P-type transistors are used, the first electrode is source and the second electrode is drain.

As stated above, using the arrangement of the first embodiment, i.e., utilizing different signal combinations as the signal sources of the driving circuit, is capable of reducing the bias of the transistors. Furthermore, adding the discharging elements, the tenth transistors 810 and 820, may further decrease the voltages of some nodes of the driving circuit. With these two ways, the present invention enhances the efficiency of the whole shift register so that the lifetime of the panel using this shift register is extended.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A shift register array comprising a plurality of shift registers, at least one shift register comprising:
    a first transistor comprising a gate, a first electrode, and a second electrode, wherein the gate and the first electrode of the first transistor receive an input signal;
    a second transistor comprising a gate, a first electrode, and a second electrode, wherein the gate of the second transistor is coupled to the second electrode of the first transistor, the second electrode of the second transistor generates an output signal, and the first electrode of the second transistor receives a first clock signal;
    a third transistor comprising a gate, a first electrode, and a second electrode, wherein the second electrode of the third transistor is coupled to a power source and the first electrode of the third transistor is coupled to the gate of the second transistor;
    another third transistor comprising a gate, a first electrode, and a second electrode, wherein the second electrode of the another third transistor is coupled to the power source, the first electrode of the another third transistor is coupled to the gate of the second transistor, and the third transistor and the another third transistor alternately pull down a voltage level at the gate of the second transistor;
    a first driving circuit being coupled to the gate of the third transistor and deposed in the at least one shift register and being configured to determine an on/off status of the third transistor in response to the input signal, the output signal, and a second clock signal, wherein the first clock signal and the second clock signal are opposite in phase, the first driving circuit comprises:
        a fourth transistor comprising a gate, a first electrode, and a second electrode, wherein the second electrode of the fourth transistor is coupled to the gate of the third transistor, and the first electrode of the fourth transistor receives the second clock signal;
        a fifth transistor comprising a gate, a first electrode, a second electrode, the gate of the fifth transistor receives the input signal, the second electrode of the fifth transistor is coupled to the power source, and the first electrode of the fifth transistor is coupled to the gate of the third transistor; and
        a sixth transistor comprising a gate, a first electrode, a second electrode, the gate of the sixth transistor receives the output signal, the second electrode of the sixth transistor is coupled to the power source, and the first electrode of the sixth transistor is coupled to the gate of the third transistor; and
    a second driving circuit being coupled to the gate of the another third transistor and deposed in the at least one shift register, being configured to determine an on/off status of the another third transistor in response to the input signal, the output signal, and the first clock signal, and comprising:
        another fourth transistor comprising a gate, a first electrode, and a second electrode, wherein the second electrode of the another fourth transistor is coupled to the gate of the another third transistor, and the first electrode of the another fourth transistor receives the first clock signal;
        another fifth transistor comprising a gate, a first electrode, a second electrode, the gate of the another fifth transistor receives the input signal, the second electrode of the another fifth transistor is coupled to the power source, and the first electrode of the another fifth transistor is coupled to the gate of the another third transistor; and
        another sixth transistor comprising a gate, a first electrode, a second electrode, the gate of the another sixth transistor receives the output signal, the second electrode of the another sixth transistor is coupled to the power source, and the first electrode of the another sixth transistor is coupled to the gate of the another third transistor.

2. The shift register array as claimed in claim 1, wherein the first driving circuit further comprises:
- a seventh transistor comprising a gate, a first electrode, and a second electrode, wherein the gate and the first electrode of the seventh transistor receive the second clock signal, and the second electrode of the seventh transistor is coupled to the gate of the fourth transistor;
- a eighth transistor comprising a gate, a first electrode, a second electrode, the gate of the eighth transistor receives the input signal, the second electrode of the eighth transistor is coupled to the power source, and the first electrode of the eighth transistor is coupled to the gate of the fourth transistor; and
- a ninth transistor comprising a gate, a first electrode, a second electrode, the gate of the ninth transistor receives the output signal, the second electrode of the ninth transistor is coupled to the power source, and the first electrode of the ninth transistor is coupled to the gate of the fourth transistor, wherein the second driving circuit further comprises:
- another seventh transistor comprising a gate, a first electrode, and a second electrode, wherein the gate and the first electrode of the another seventh transistor receive the first clock signal, and the second electrode of the another seventh transistor is coupled to the gate of the another fourth transistor;
- another eighth transistor comprising a gate, a first electrode, a second electrode, the gate of the another eighth transistor receives the input signal, the second electrode of the another eighth transistor is coupled to the power source, and the first electrode of the another eighth transistor is coupled to the gate of the another fourth transistor; and
- another ninth transistor comprising a gate, a first electrode, a second electrode, the gate of the another ninth transistor receives the output signal, the second electrode of the another ninth transistor is coupled to the power source, and the first electrode of the another ninth transistor is coupled to the gate of the another fourth transistor.

3. The shift register array as claimed in claim 2, wherein the first driving circuit further comprises a tenth transistor comprising a gate, a first electrode, a second electrode, the gate of the tenth transistor receives the first clock signal, the second electrode of the tenth transistor is coupled to the power source, and the first electrode of the tenth transistor is coupled to the gate of the fourth transistor, wherein the second driving circuit further comprises another tenth transistor comprising a gate, a first electrode, a second electrode, the gate of the another tenth transistor receives the first clock signal, the second electrode of the another tenth transistor is coupled to the power source, and the first electrode of the another tenth transistor is coupled to the gate of the another fourth transistor.

4. The shift register array as claimed in claim 1, wherein the input signal is an output signal of a shift register at a previous stage.

5. The shift register array as claimed in claim 1, wherein the output signal is an input signal of a shift register at a next stage.

6. A display apparatus, comprising:
- a display array comprising a plurality of pixels; and
- a shift register array comprising a plurality of shift registers, each shift register being configured to drive a pixel of the display array, at least one shift register comprising:
  - a first transistor comprising a gate, a first electrode, and a second electrode, wherein the gate and the first electrode of the first transistor receive an input signal;
  - a second transistor comprising a gate, a first electrode, and a second electrode, wherein the gate of the second transistor is coupled to the second electrode of the first transistor, the second electrode of the second transistor generates an output signal, and the first electrode of the second transistor receives a first clock signal;
  - a third transistor comprising a gate, a first electrode, and a second electrode, wherein the second electrode of the third transistor is coupled to a power source and the first electrode of the third transistor is coupled to the gate of the second transistor;
  - another third transistor comprising a gate, a first electrode, and a second electrode, wherein the second electrode of the another third transistor is coupled to the power source, the first electrode of the another third transistor is coupled to the gate of the second transistor, and the third transistor and the another third transistor alternately pull down a voltage level at the gate of the second transistor;
  - a first driving circuit being coupled to the gate of the third transistor and deposed in the at least one shift register and being configured to determine an on/off status of the third transistor in response to the input signal, the output signal, and a second clock signal, wherein the first clock signal and the second clock signal are opposite in phase, the first driving circuit comprises:
    - a fourth transistor comprising a gate, a first electrode, and a second electrode, wherein the second electrode of the fourth transistor is coupled to the gate of the third transistor, and the first electrode of the fourth transistor receives the second clock signal;
    - a fifth transistor comprising a gate, a first electrode, a second electrode, the gate of the fifth transistor receives the input signal, the second electrode of the fifth transistor is coupled to the power source, and the first electrode of the fifth transistor is coupled to the gate of the third transistor; and
    - a sixth transistor comprising a gate, a first electrode, a second electrode, the gate of the sixth transistor receives the output signal, the second electrode of the sixth transistor is coupled to the power source, and the first electrode of the sixth transistor is coupled to the gate of the third transistor; and
  - a second driving circuit being coupled to the gate of the another third transistor and deposed in the at least one shift register, being configured to determine an on/off status of the another third transistor in response to the input signal, the output signal, and the first clock signal, and comprising:
    - another fourth transistor comprising a gate, a first electrode, and a second electrode, wherein the second electrode of the another fourth transistor is coupled to the gate of the another third transistor, and the first electrode of the another fourth transistor receives the first clock signal;
    - another fifth transistor comprising a gate, a first electrode, a second electrode, the gate of the another fifth transistor receives the input signal, the second electrode of the another fifth transistor is coupled to the power source, and the first electrode of the another fifth transistor is coupled to the gate of the another third transistor; and another sixth transistor comprising a gate, a first electrode, a second electrode, the gate of the another sixth transistor receives the output signal, the second electrode of the another sixth transistor is coupled to the power source, and the first electrode of the another sixth transistor is coupled to the gate of the another third transistor.

7. The display apparatus as claimed in claim 6, wherein the first driving circuit further comprises:
   a seventh transistor comprising a gate, a first electrode, and a second electrode, wherein the gate and the first electrode of the seventh transistor receive the second clock signal, and the second electrode of the seventh transistor is coupled to the gate of the fourth transistor;
   a eighth transistor comprising a gate, a first electrode, a second electrode, the gate of the eighth transistor receives the input signal, the second electrode of the eighth transistor is coupled to the power source, and the first electrode of the eighth transistor is coupled to the gate of the fourth transistor; and
   a ninth transistor comprising a gate, a first electrode, a second electrode, the gate of the ninth transistor receives the output signal, the second electrode of the ninth transistor is coupled to the power source, and the first electrode of the ninth transistor is coupled to the gate of the fourth transistor,
   wherein the second driving circuit further comprises:
   another seventh transistor comprising a gate, a first electrode, and a second electrode, wherein the gate and the first electrode of the another seventh transistor receive the first clock signal, and the second electrode of the another seventh transistor is coupled to the gate of the another fourth transistor;
   another eighth transistor comprising a gate, a first electrode, a second electrode, the gate of the another eighth transistor receives the input signal, the second electrode of the another eighth transistor is coupled to the power source, and the first electrode of the another eighth transistor is coupled to the gate of the another fourth transistor; and
   another ninth transistor comprising a gate, a first electrode, a second electrode, the gate of the another ninth transistor receives the output signal, the second electrode of the another ninth transistor is coupled to the power source, and the first electrode of the another ninth transistor is coupled to the gate of the another fourth transistor.

8. The display apparatus as claimed in claim 7, wherein the driving circuit further comprises a tenth transistor comprising a gate, a first electrode, a second electrode, the gate of the tenth transistor receives the first clock signal, the second electrode of the tenth transistor is coupled to the power source, and the first electrode of the tenth transistor is coupled to the gate of the fourth transistor, wherein the second driving circuit further comprises another tenth transistor comprising a gate, a first electrode, a second electrode, the gate of the another tenth transistor receives the first clock signal, the second electrode of the another tenth transistor is coupled to the power source, and the first electrode of the another tenth transistor is coupled to the gate of the another fourth transistor.

9. The display apparatus as claimed in claim 6, wherein the input signal is an output signal of a shift register at a previous stage.

10. The display apparatus as claimed in claim 6, wherein the output signal is an input signal of a shift register at a next stage.

* * * * *